United States Patent
Borenstain

(10) Patent No.: US 6,172,379 B1
(45) Date of Patent: Jan. 9, 2001

(54) METHOD FOR OPTIMIZING QWIP GRATING DEPTH

(75) Inventor: Shmuel I. Borenstain, Gush-Etzion (IL)

(73) Assignee: Sagi-Nahor Ltd., Jerusalem (IL)

(*) Notice: Under 35 U.S.C. 154(b), the term of this patent shall be extended for 0 days.

(21) Appl. No.: 09/123,487

(22) Filed: Jul. 28, 1998

(51) Int. Cl.$^7$ .............................. H01L 29/06; H01L 29/12
(52) U.S. Cl. ................................ 257/21; 257/14; 257/441
(58) Field of Search ................................ 257/441, 14, 21

(56) References Cited

U.S. PATENT DOCUMENTS

| | | |
|---|---|---|
| 5,063,419 | 11/1991 | Glaser et al. . |
| 5,075,749 | 12/1991 | Chi et al. . |
| 5,185,647 | 2/1993 | Vasquez . |
| 5,229,614 | 7/1993 | Andersson et al. . |
| 5,506,419 | 4/1996 | Levine et al. . |
| 5,784,399 | * 7/1998 | Sun . |
| 5,818,066 | * 10/1998 | Duboz . |
| 6,054,718 | * 4/2000 | Dodd et al. . |

OTHER PUBLICATIONS

Sarusi et al, "Improved Performance of Quantum Well Infrared Photodetectors Using Random Scattering Optical Coupling", *Appl. Phy. Lett.*, 64(8):960–962, 1994.

Zussman et al, "Extended Long–Wavelength $\lambda$=11–15 $\mu$m GaAs/Al$_x$Ga$_{1-x}$As Quantum–Well Infrared Photodetectors", *J. Appl. Phys.*, 70(9): 5101–5107, 1991.

Lundqvist et al, "Efficiency of Grating Coupled AlGaAs/GaAs Quantum Well Infrared Detectors", *Appl. Phy. Lett.*, 63(24): 3361–3363, 1993.

Andersson et al, "Grating–Coupled Quantum–Well Infrared Detectors: Theory and Performance", *J. Appl. Phys.*, 71(7): 36003610, 1992.

Andersson et al, "320×240 Pixels Quantum–Well Infrared Photodetector (QWIP) Array for Thermal Imaging: Fabrication and Evaluation", *SPIE*, vol. 3061, pp 740–748, no year given.

Andersson et al, "Near–Unity Quantum Efficiency of AlGaAs/GaAs Quantum Well Infrared Detectors Using a Waveguide With a Doubly Periodic Grating Coupler", *Appl. Phy. Lett.*, 59(7): 857–859, 1991.

Smith et al, "A New Infrared Detector Using Electron Emission from Multiple Quantum Wells", *J. Vac. Sci. Technol.*, B 1(2): 376–378, 1983.

Chiu et al, "Application of Internal Photoemission From Quantum Well and Heterojunction Superlattices to Infrared Photodetectors". *Infrared Phys.*, 23(2): 93–97, 1983.

Goosen et al, "Performance Aspects of a Quantum Well Detector", *J. Appl. Phys.*, 63(10): 5149–5153, 1988.

Lee et al, "Quantum Well Infrared Photodetectors With Bi–Periodic Grating Couplers", *Appl. Phy. Lett.*, 61(20): 2437–2439, 1992.

High–Detectivity GaAs Quantum Well Infrared Detectors with Peak Responsivity at 8.2 $\mu$m, *J. Appl. Phys.*, 67(2): 7608–7611, 1990.

Yu et al, "A Study of the Coupling Efficiency versus Grating Periodicity in a normal Incident GaAs/AlGaAs Multiquantum Well Infrared Detector", *J. Appl. Phys.*, 72(6): 2105–2109, 1992.

Schimert et al, "Enhanced Quantum Well Infrared Photodetector With Novel Multiple Quantum Well Grating Structure", *Appl. Phy. Lett.*, 68(20): 2846–2848, 1996.

* cited by examiner

*Primary Examiner*—Stephen D. Meier
(74) *Attorney, Agent, or Firm*—Mark M. Friedman

(57) ABSTRACT

A method for optimizing the depth of the grating of a QWIP with respect to light of a particular frequency, and the QWIP so designed. A scalar expression for the intensity of light scattered from the grating is multiplied by an absorption factor for forward and backward propagation through the QWIP and integrated over all scattering angles. Quantum efficiency is maximized when the depth of the grating is in a range slightly higher than an odd multiple of one-quarter of the wavelength of the light inside the QWIP.

9 Claims, 4 Drawing Sheets

METHOD FOR OPTIMIZING QWIP GRATING DEPTH

FIELD AND BACKGROUND OF THE INVENTION

The present invention relates to quantum well infrared photodetectors (QWIP) and, more particularly, to a simple way to optimize the geometry of a grating of a QWIP with respect to detection of light of a certain frequency, and the QWIP so designed.

QWIPs are devices for detecting medium and long wavelength infrared light. These devices rely on quantum wells, typically multiple quantum wells, to provide effective bandgaps that are narrower than can be achieved easily in homogeneous semiconductors. The theory and design of QWIPs is reviewed by B. F. Levine in "Quantum-well infrared photodetectors", *Journal of Applied Physics* vol. 74 no. 8 (Oct. 15, 1993), pp. R1–R81.

FIG. 1 is a schematic cross-section of a typical QWIP 10. QWIP 10 consists of parallel layers of a low-band-gap semiconductor 14 embedded in a relatively higher-band-gap semiconductor 12. For example, semiconductor 14 may be GaAs and semiconductor 12 may be $Al_xGa_{1-x}As$. Ellipsis 16 indicates that there typically are many more layers than are shown in FIG. 1. In fact, a typical QWIP includes on the order of 50 periods of alternating layers 12 and 14. Layers 14 are quantum wells. This structure of alternating layers 12 and 14 is formed on a GaAs contact layer 13 above a GaAs substrate 15 and is capped by a GaAs contact layer 13'.

Many variations of the illustrative example of FIG. 1 exist. For example:

(a) Layers 12, 13, 13' and 15 may be Si, and layers 14 may be $Si_xGe_{1-x}$. (b) Layers 12, 13, 13' and 15 may be InP, and layers 14 may be InGaAsP or InGaAs. (c) Layers 13, 13', 14 and 15 may be GaAs and layers 12 may be GaInP. (d) On a GaAs substrate, alternating barrier layers of AlGaAs and multilayer quantum wells; each quantum well consists of a sandwich of a central InGaAs layer between two GaAs layers; thin tunneling barrier layers of AlAs intervene between the quantum wells and the AlGaAs layers.

Other variations may be found in Levine's review article.

Because these semiconductors have indices of refraction, with respect to the propagation of infrared light, that are significantly greater than 1, infrared light incident from below on front surface 18 of QWIP 10 at almost any angle of incidence is refracted to propagate almost perpendicular to quantum wells 14. This makes the electric field vector of the light almost parallel to quantum wells 14. Unfortunately, it is only the component of the electric field perpendicular to quantum wells 14 that interacts with quantum wells 14. A common way to overcome this problem is to provide a two-dimensional grating 22, parallel to quantum wells 14, on back surface 20 of QWIP 10 to scatter the light, thereby causing the light to propagate within QWIP 10 in directions oblique and parallel to quantum wells 14 as well as perpendicular to quantum wells 14.

The geometry of grating 22 is defined by three parameters: pitch p, cavity width w, and cavity depth d. Pitch p define the lateral periodicities of grating 22. To enhance the performance of QWIP 10 with respect to infrared light of a frequency ν, i.e., a free-space wavelength $\lambda=c/\nu$ (where c is the speed of light in a vacuum) by promoting constructive interference of light scattered parallel to grating 22, p is set equal to the wavelength of the light inside QWIP 10, $\lambda/n$, where n is the index of refraction of semiconductor 13' with respect to light of frequency ν. Note that the infrared light for which the performance of QWIP 10 is optimized is defined herein in terms of frequency rather than in terms of wavelength to avoid confusion between the free-space wavelength of the light and the wavelength of the light within QWIP 10.

Two methods are known for selecting cavity depth d. The first is to use a simple rule of thumb, as taught by Chi et al. in U.S. Pat. No. 5,075,749. Light reflected from back surface 20 at an angle smaller than the critical angle of total internal reflection within QWIP 10 escapes from front surface 18. To suppress this, d is selected to promote destructive interference of light scattered perpendicular to grating 22. Specifically, to enhance the performance of QWIP 10 with respect to infrared light of frequency ν, d is set equal to c/4nν, one-quarter of the wavelength of the light inside QWIP 10.

The second is to solve Maxwell's equations for the electromagnetic field inside QWIP 10 for a suite of values of d and to select the value of d that maximizes the quantum efficiency of QWIP 10. For example, J. Y. Andersson and L. Lundqvist, in "Grating-coupled quantum-well infrared detectors: theory and performance", *Journal of Applied Physics* vol. 71 no. 7 (Apr. 1, 1992) pp. 3600–3610, used the modal expansion method to calculate quantum efficiencies of a model QWIP 10 at various values of w and d to determine optimal values of w and d.

The regular geometry of grating 22 is not the only possible geometry. Levine et al., in U.S. Pat. No. 5,506,419, which is incorporated by reference for all purposes as if fully set forth herein, teach a QWIP grating with a pseudo-random geometry. In one variant of the pseudo-random geometry, the lateral dimensions of the grating cavities varies pseudo-randomly, while the depths of the cavities can have one of several values. These depths are selected as multiples of the quarter wavelength taught by Chi et al. in U.S. Pat. No. 5,075,749. It should be noted that the vector computation of Andersson and Lundqvist can be performed only for a grating such as grating 22 that has a regularly periodic geometry, and not for the pseudo-random geometries of Levine et al., U.S. Pat. No. 5,075,749.

SUMMARY OF THE INVENTION

The present invention falls in complexity between the rule of thumb of Chi et al., U.S. Pat. No. 5,075,749 and the full-blown vector calculation of Andersson and Lundqvist. Surprisingly, it has been found that a simple scalar calculation of quantum efficiency gives a QWIP design superior in performance to that taught by Chi et al. in U.S. Pat. No. 5,075,749, and nevertheless is applicable to nonperiodic grating geometries such as the pseudo-random geometry of Levine et al., U.S. Pat. No. 5,506,419.

Therefore, according to the present invention there is provided a method for selecting at least one depth of a grating of a QWIP to enhance detection of light of a certain frequency, including the steps of: (a) forming a scalar expression for an intensity of the light within the QWIP, as a function of the at least one depth; (b) estimating a quantum efficiency of the QWIP, based on the scalar expression, at a plurality of values of the at least one depth; and (c) selecting one of the plurality of values that maximizes the quantum efficiency.

Furthermore, according to the present invention there is provided a QWIP for detecting light of a certain frequency, the light having a certain wavelength when propagating within the QWIP, including: (a) at least one planar quantum well; and (b) a grating, parallel to the at least one planar quantum well, having a depth greater than an odd multiple of one-quarter of the wavelength and less than the odd multiple of about three-tenths of the wavelength.

Furthermore, according to the present invention there is provided a QWIP for detecting light of a certain frequency, including: (a) at least one planar quantum well; and (b) a grating, parallel to the at least one planar quantum well, and having at least one depth selected by estimating a quantum efficiency of the QWIP based on a scalar expression for an intensity of the light within the QWIP, the scalar expression being a function of the at least one depth.

Furthermore, according to the present invention there is provided a method for selecting at least one depth of a grating of a QWIP to enhance detection of light in a plurality of frequency bands, including the steps of: (a) selecting a representative frequency from among the frequency bands; (b) forming a scalar expression for an intensity of light of the representative frequency within the QWIP, as a function of the at least one depth; (c) estimating a quantum efficiency of the QWIP, based on the scalar expression, at a plurality of values of the at least one depth; and (d) selecting one of the plurality of the values that maximizes the quantum efficiency.

Furthermore, according to the present invention there is provided a method for selecting at least one depth of a grating of a QWIP to enhance detection of light in a range of frequencies, including the steps of: (a) forming a scalar expression for an intensity, within the QWIP, of light in the range of frequencies, as a function of the at least one depth; (b) estimating a quantum efficiency of the QWIP, based on an integral over the range of frequencies of an integrand including the scalar expression, at a plurality of values of the at least one depth; and (c) selecting one of the plurality of the values that maximizes the quantum efficiency.

The method of the present invention selects the optimal value of grating depth by finding the depth value that maximizes the quantum efficiency of the QWIP. Preferably, this quantum efficiency is computed at a plurality of depth values, as follows: First, a scalar expression is obtained for the intensity of light scattered from the grating, as a function of scattering angle. Next, the absorption is calculated for two passes through the quantum wells. The first pass is of light directed towards the front surface of the QWIP. The second pass is of light reflected from the front surface back to the grating. Finally, the quantum efficiency is calculated by integrating the product of intensity and absorption over all scattering angles.

The present invention is described herein with reference to a grating such as grating 22 whose geometry is defined by only one value of cavity depth. Nevertheless, it will be clear to those ordinarily skilled in the art how to apply the method of the present invention to a grating, such as the pseudo-random grating of Levine et al., U.S. Pat. No. 5,506,419, whose geometry is defined by multiple values of cavity depth.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method of optimizing the geometry of a QWIP grating with respect to efficient detection of infrared light of a certain frequency, and the QWIP so designed. Specifically, the present invention can be used to design a QWIP grating that is more efficient than those designed using rules of thumb, without the extensive numerical modeling required by the prior art methods.

The principles and operation of a QWIP grating according to the present invention may be better understood with reference to the drawings and the accompanying description.

The grating is considered to have two parts, one of depth 0 and the other of depth d. The area of one part is u times smaller than the other ($u \leq 1$), giving a duty cycle of $1/(1+u)$. For example, in the case of grating 22, $u=(p-w)^2/w^2$ for $w/p \geq \frac{1}{2}$ and $u=w^2/(p-w)^2$ for $w/p \leq \frac{1}{2}$. The analysis is similar to the analysis of the interference pattern in a Fabry-Perot etalon. The optical path difference between the two beams reflected from the two parts of the grating is $$\Delta = nd(1+\cos\phi) \tag{1}$$

where $\phi$ is the scattering angle. The amplitude of the electric field at a distance x from the outer part of the grating is the sum of the two beams:

$$E \approx (e^{ik(x+\Delta)} + ue^{ikx}) = e^{ikx}(u + e^{ik\Delta}) \tag{2}$$

where $k=2\pi v/c$ is the wavenumber. The intensity is given by $$I = |E|^2 = (u+e^{ik\Delta})(u+e^{-ik\Delta}) = (u^2+1)+2u\cos(k\Delta) \tag{3}$$

The same expression obtains whether u refers to the outer or inner part of the grating. Following the rule of thumb of Chi et al., U.S. Pat. No. 5,075,749, to eliminate the back-reflected intensity (($\phi=0$) requires that $u=1$, i.e., the two parts of the grating have equal areas. The remaining development herein will assume $u=1$, it being straightforward to modify the computation for the case $u<1$. With $u=1$, $$I(\phi,d) = (\cos\phi+1)^2\{1+\cos[2\pi nd\nu(1+\cos\phi)/c]\} \tag{4}$$

Figure 1:
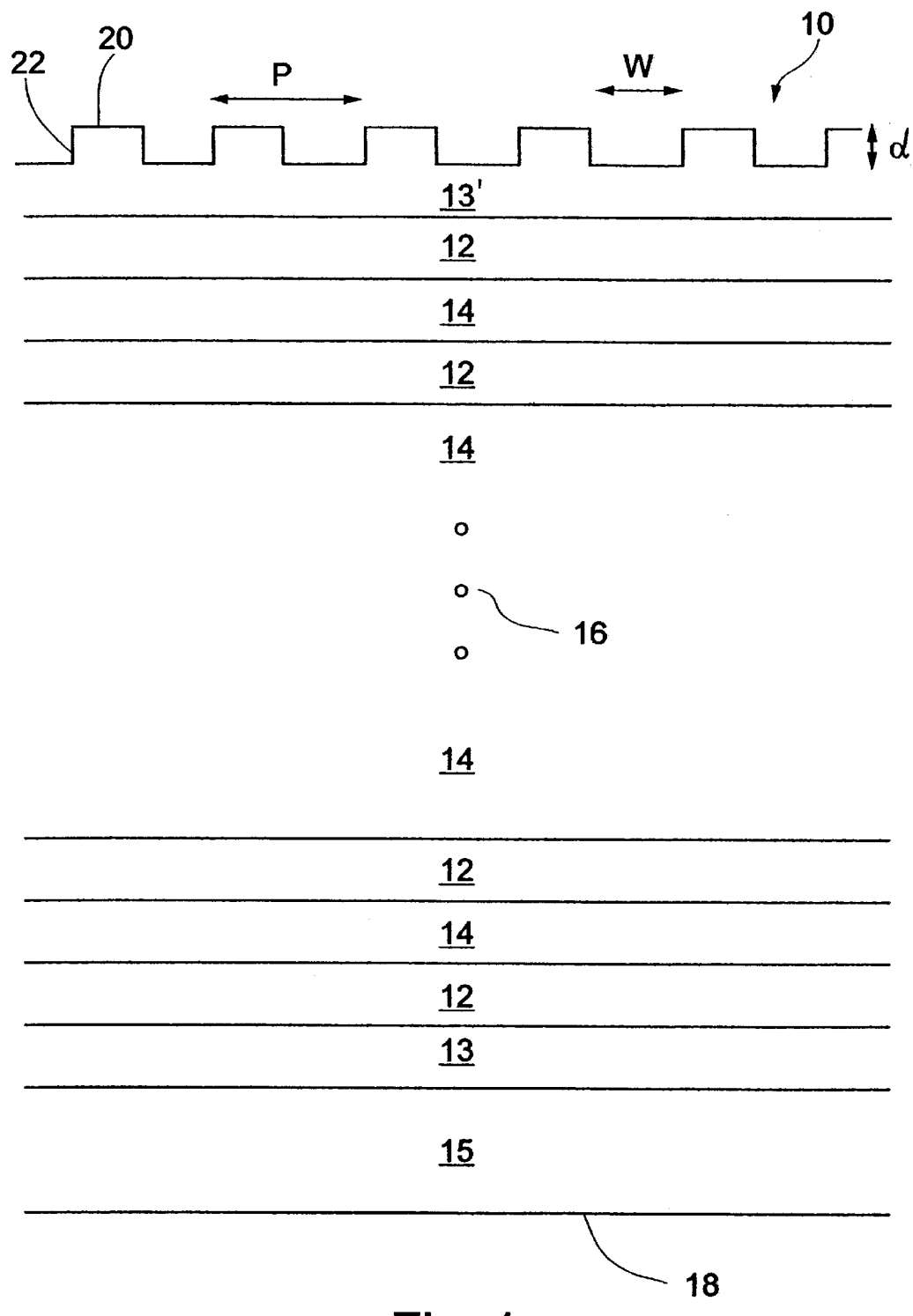
FIG. 1 is a schematic cross-section of a QWIP.
Figure 2:
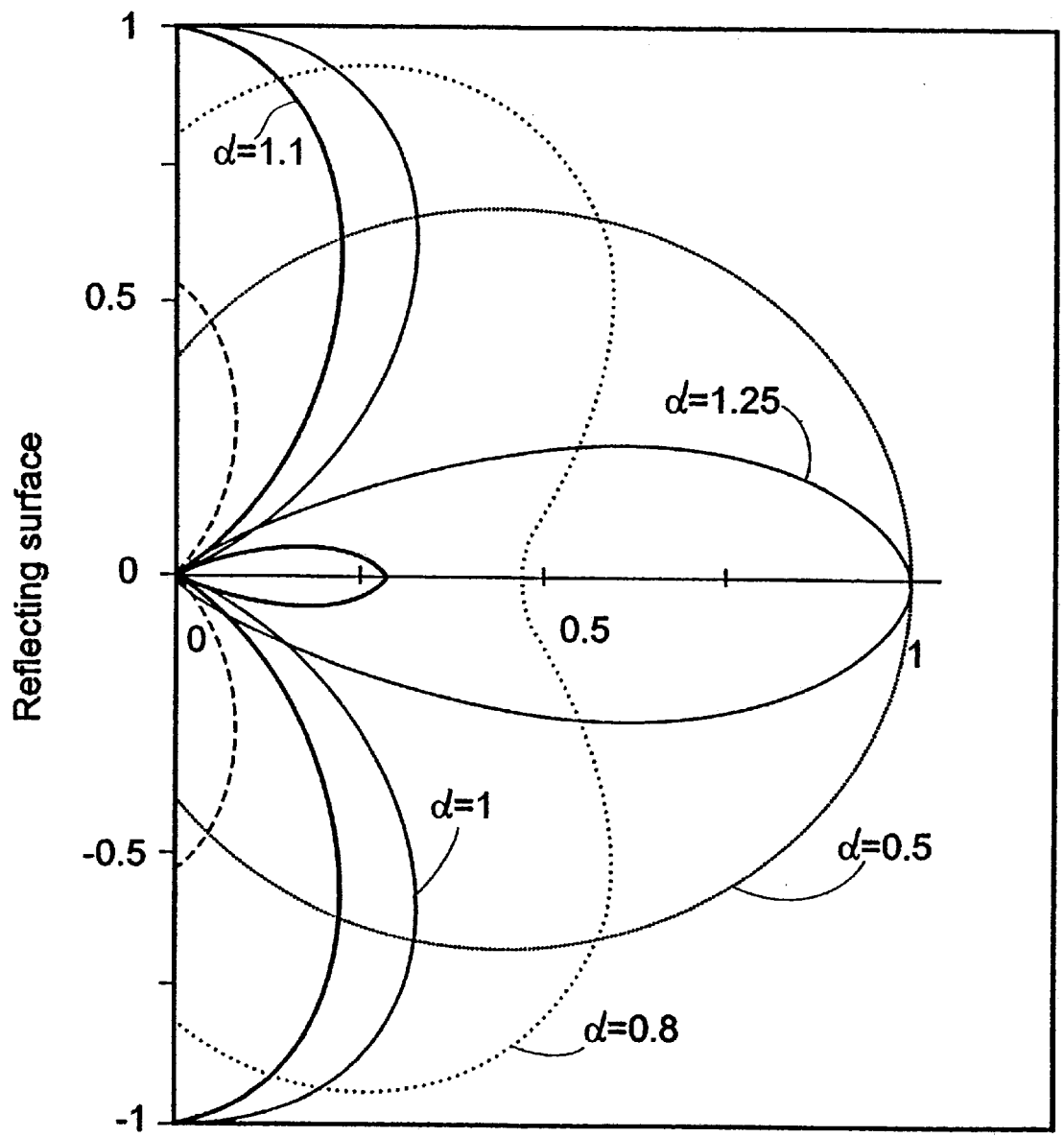
FIG. 2 is a polar plot of intensities as functions of scattering angles, at several normalized grating depths.

The left term on the right hand side of Equation (4) is Huygens' obliquity factor (P. A. Jenkins & H. E. White, *Fundamentals of Optics*, McGraw-Hill, 1976, p. 380). As expected, if $d=d_0=c/4n\nu$, one-quarter of a wavelength inside the QWIP, $I(0,d)=0$. FIG. 2 is a polar plot of $I(\phi,d)$, with d normalized to $d_0$.

The total reflected intensity and the normalization factor N are found by integrating the scattered radiation over a half space:

$$\frac{2\pi}{N} = \int_0^{2\pi} d\vartheta \int_0^{\pi/2} I(\varphi, d)\sin\varphi d\varphi \tag{5}$$

The absorption coefficient of a single quantum well is given by $$\alpha = N_w e^2 G(\nu) f \sin^2\phi/(4 \text{ cn } m^* \epsilon_0) \tag{6}$$

(W. Heitler, *The Quantum Theory of Radiation*, Dover, 1984, p. 186), where $N_w$ is the 3D electron density in the quantum well, e is the electron charge, $m^*$ is the electron effective mass in the quantum well, $\epsilon_0$ is the dielectric constant and f is the oscillator strength. The spectral shape $G(v)$ of the transition is a Lorentzian. At the peak, $G(v_0)=\Gamma^{-1}$, where $\Gamma$ is the spectral bandwidth. The dimensionless absorption factor after a first pass through M quantum wells, a reflection from the front surface and a second pass through the M quantum wells is given by $$A(\varphi) = \chi\left(1 - e^{-\alpha\frac{\sin^2\varphi}{\cos\varphi}M(1+R(\varphi))}\right) \quad (7)$$

where $\alpha$ is the dimensionless geometry-independent absorption per well, defined as $\alpha = \alpha L_w/\sin^2\phi$, where $L_w$ is the thickness of one quantum well. If there is an antireflection coating on the front surface, then the reflection coefficient R at the front surface is either zero for angles smaller than the critical angle and one for larger angles. The polarization correction factor $\chi$ for an ordered 2D grating was shown by Andersson and Lundqvist to be unity. This is expected to be the case also for a pseudo-random 2D grating. The total quantum efficiency (QE) of the QWIP is obtained by integrating the product of $A(\phi)$ and $I(\phi)$ over the halfspace:

$$\eta(d) = N\int_0^{\pi/2} A(\varphi)I(\varphi, d)\sin\varphi d\varphi \quad (8)$$

Figure 3:
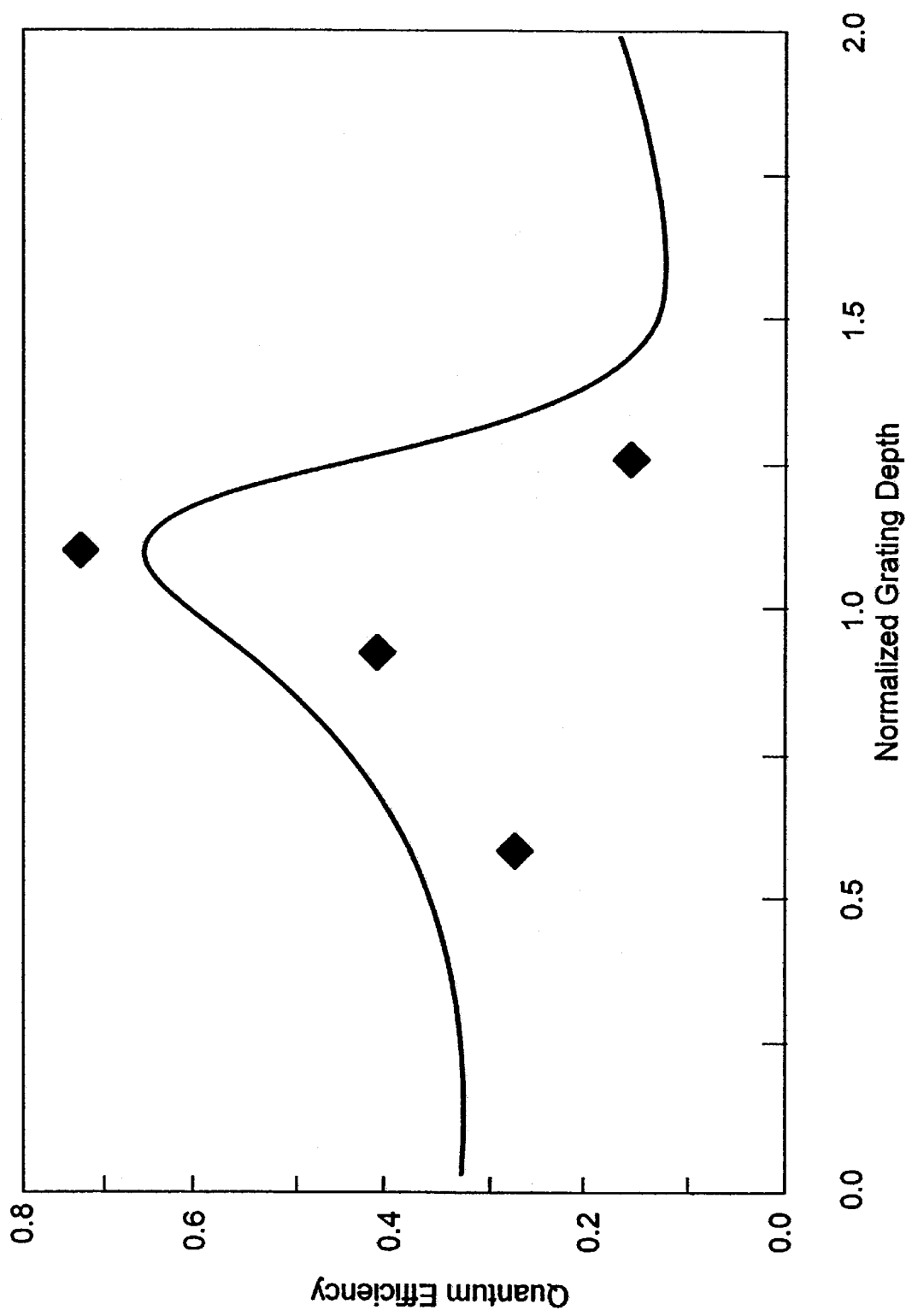
FIG. 3 shows predicted and observed quantum efficiencies as a function of normalized grating depth.

FIG. 3 shows the QE obtained using Equation (8) with a typical absorption value of $\alpha=0.3\%$. Contrary to the prior art rule of thumb, the peak QE is not at $d=d_0$, but at $d=1.11d_0$. In fact, the entire interval $d_0<d<1.2d_0$ gives at least as good a QE as $d=d_0$. This is explained with reference to FIG. 2. At $d=1.11d_0$, the intensity distribution, although non-zero at $\phi=0$, is flattened sideways, enhancing absorption because of the component of light propagation parallel to the quantum well layers.

QWIPs were fabricated having a multiple quantum well structure that consisted of 50 periods of $3.5\times10^{17}$ cm$^{-3}$ Si doped 40 Å thick GaAs layer embedded between 500 Å thick $Ga_{0.73}Al_{0.27}As$ barrier layers. The cladding layers outside the IR active multiple quantum well structure consisted of $5.0\times10^{17}$ cm$^{-3}$ Si doped, 0.7 microns thick GaAs at the bottom of the multiple quantum well structure and 0.9 microns thick at the top of the structure. Four QWIPs, 200×200 microns each, were fabricated on a GaAs wafer. Each QWIP was etched to a different depth by reactive ion etching to form an ordered, crossed 2D grating. The pitch of the gratings was 2.7 microns, to maximize the QE in a photoresponse band centered at a free-space wavelength of 8.7 microns. Ohmic contacts were evaporated onto the gratings and onto the bottom contact layers using the standard Au/Ge/Ni/Au evaporation and annealing process. The dots in FIG. 3 indicate the measured QEs of the four QWIPs. There is in fact a QE maximum at a grating depth of 1.11 $d_0$, as predicted. The observed QE is sharper than predicted, most likely because of the enhancement of QE provided by the periodicity of an ordered grating.

Figure 4:
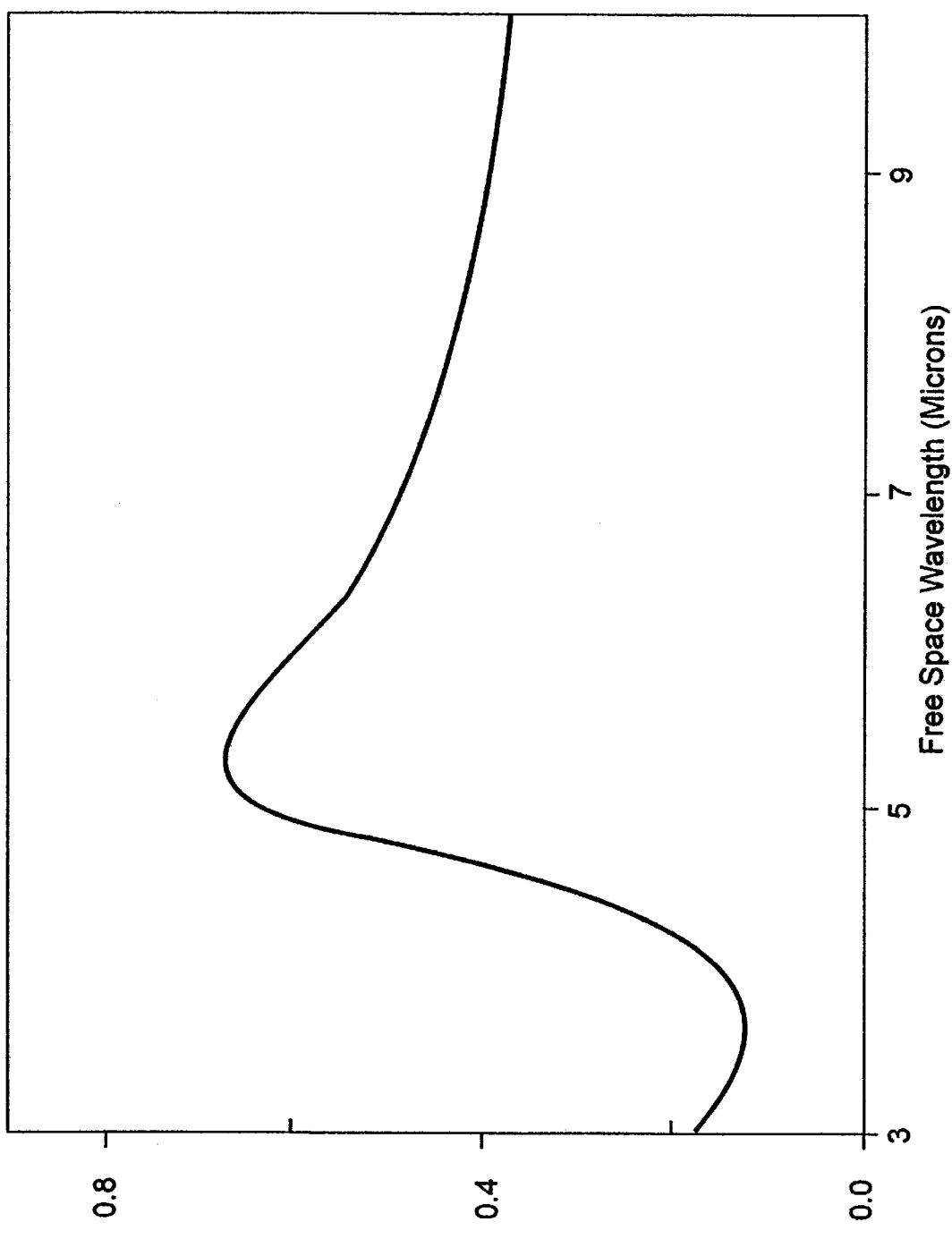
FIG. 4 is a plot of predicted quantum efficiency vs. free space wavelength for a grating with a depth of 0.45 microns.

As is well known in the art, a QWIP can be prepared to be sensitive to several frequency bands. By varying the bias on this type of QWIP, the sensitivity can be switched among the frequency bands. The method of the present invention is directed primarily towards optimizing the grating depth at a single frequency; but an appropriately selected frequency is representative of several frequency bands. FIG. 4 shows quantum efficiencies calculated using Equation (8) for a QWIP with d=0.45 microns, assuming $\alpha=0.3\%$ as above. The abscissa is free space wavelength, in microns. It is evident that to obtain a grating depth that is optimal, in an average sense, across a range of frequencies that spans two or more bands of interest, a representative frequency should be selected towards the high frequency (low wavelength) end of the range. The illustrated case shows that a grating depth of 0.45 microns is close to optimal for both the 5 micron band and the 9 micron band, which are important windows of atmospheric transparency.

More generally, the grating depth of a QWIP can be optimized in a frequency range $[v_1,v_2]$. The expression for the integrated quantum efficiency that is optimized is $$\eta_{int}(d) = \int_{v_1}^{v_2} N(v)\int_0^{\pi/2} A(v, \varphi)I(v, \varphi, d)\sin\varphi d\varphi dv \quad (9)$$

where A, I and the normalization factor N of Equation (5) now are functions of frequency. The limits of integration $v_1$, and $v_2$ are determined by $G(v)$ through $A(v,\phi)$ (Equation (6)), which decays rapidly to zero beyond $\pm\Gamma$ from the center of the band $v_0$.

The description herein has focused on grating depths in the vicinity of $d_0$. Similar results are obtained at odd multiples of $d_0$ ($3d_0$, $5d_0$, etc.): the QE of a QWIP, with respect to detection of light that has a certain wavelength within the QWIP, is maximized when the depth of the grating is slightly more than an odd multiple of one-quarter of that wavelength.

While the invention has been described with respect to a limited number of embodiments, it will be appreciated that many variations, modifications and other applications of the invention may be made.

What is claimed is:

1. A QWIP for detecting light of a certain frequency, the light having a certain wavelength when propagating within the QWIP, comprising:
   (a) at least one planar quantum well; and
   (b) a grating, parallel to said at least one planar quantum well, having a depth greater than an odd multiple of one-quarter of said wavelength and less than said odd multiple of about three-tenths of said wavelength.

2. The QWIP of claim 1, wherein said depth is between said odd multiple of about 0.2775 of said wavelength and said odd multiple of about three-tenths of said wavelength.

3. The QWIP of claim 5, wherein said depth is said odd multiple of about 0.2775 of said wavelength.

4. The QWIP of claim 3, wherein said odd multiple is a unit multiple.

5. The QWIP of claim 1, wherein said grating has a pitch selected to enhance scattering of the light by said grating within the QWIP in a direction parallel to the grating.

6. The QWIP of claim 1, wherein said grating has a pseudo-random lateral geometry.

7. A QWIP for detecting light of a certain frequency, comprising:
   (a) at least one planar quantum well; and
   (b) a grating, parallel to said at least one planar quantum well, and having at least one depth selected by estimating a quantum efficiency of the QWIP based on a scalar expression for an intensity of the light within the QWIP, said scalar expression being a function of said at least one depth.

8. The QWIP of claim 7, wherein said grating has a pitch selected to enhance scattering of the light by said grating within the QWIP in a direction parallel to the grating.

9. The QWIP of claim 7, wherein said grating has a pseudo-random lateral geometry.

* * * * *